US012645856B2

(12) United States Patent
Das et al.

(10) Patent No.: US 12,645,856 B2
(45) Date of Patent: Jun. 2, 2026

(54) CREATION OF REDUCED FORMAL MODEL FOR SCALABLE SYSTEM-ON-CHIP (SOC) LEVEL CONNECTIVITY VERIFICATION

(71) Applicant: Synopsys, Inc., Sunnyvale, CA (US)

(72) Inventors: Prasun Das, Bangalore (IN); Pratik Mahajan, Santa Clara, CA (US); Alfred Koelbl, Mosier, OR (US); Henna Arora, Howrah (IN)

(73) Assignee: Synopsys, Inc., Sunnyvale, CA (US)

( * ) Notice: Subject to any disclaimer, the term of this patent is extended or adjusted under 35 U.S.C. 154(b) by 661 days.

(21) Appl. No.: 18/076,007

(22) Filed: Dec. 6, 2022

(65) Prior Publication Data

US 2023/0177244 A1 Jun. 8, 2023

Related U.S. Application Data

(60) Provisional application No. 63/287,011, filed on Dec. 7, 2021.

(51) Int. Cl.
*G06F 30/3323* (2020.01)
*G06F 30/323* (2020.01)

(52) U.S. Cl.
CPC ........ *G06F 30/3323* (2020.01); *G06F 30/323* (2020.01)

(58) Field of Classification Search
CPC ........................... G06F 30/3323; G06F 30/323

USPC .......................................................... 716/103
See application file for complete search history.

(56) References Cited

U.S. PATENT DOCUMENTS

| | | | | |
|---|---|---|---|---|
| 5,452,239 | A * | 9/1995 | Dai | G06F 30/331 |
| | | | | 716/108 |
| 8,296,695 | B1 * | 10/2012 | Chen | G06F 30/394 |
| | | | | 716/132 |
| 2009/0106612 | A1 * | 4/2009 | Pandey | G06F 11/267 |
| | | | | 714/E11.155 |
| 2011/0252390 | A1 * | 10/2011 | Sripada | G06F 30/33 |
| | | | | 716/113 |
| 2017/0074932 | A1 * | 3/2017 | Kourfali | G06F 30/331 |

* cited by examiner

*Primary Examiner* — Suchin Parihar
(74) *Attorney, Agent, or Firm* — Weaver Austin Villeneuve & Sampson LLP

(57) ABSTRACT

A method of verifying connectivity in a circuit design, includes, in part, receiving a netlist of the circuit design; designating a plurality of destination nodes associated with the netlist; for each of the plurality of destination nodes, identifying one or more source nodes that are traversed from the destination node; for each source node identified as traversed from the destination node: transforming the netlist by including a first multiplexer having a first input terminal receiving a first variable logic value and an output terminal coupled to the source node; and enabling the first multiplexer to pass the first variable value to the destination node from the source node in order to check for connectivity between the source node and the destination node.

20 Claims, 13 Drawing Sheets

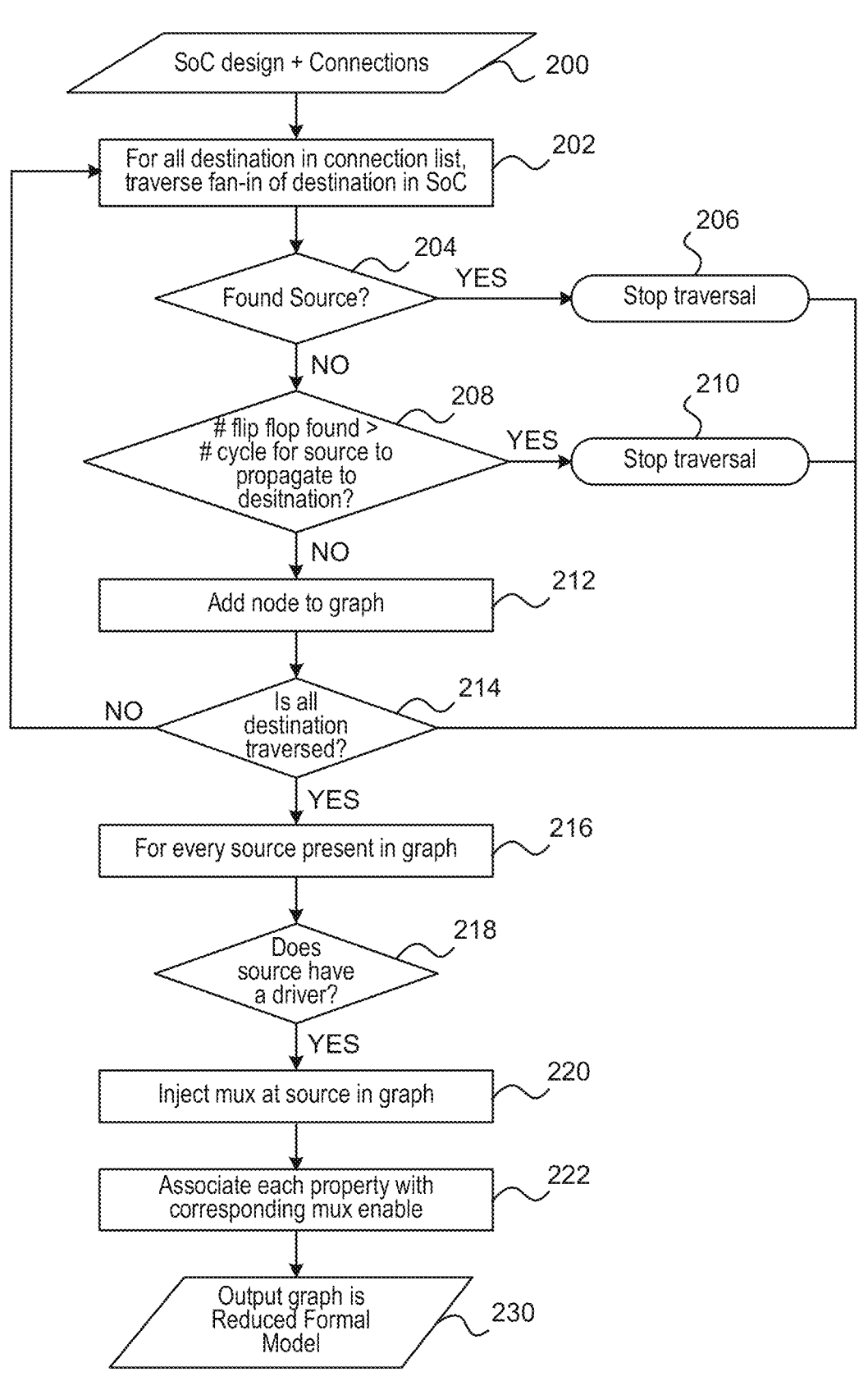

SoC design + Connections 200

For all destination in connection list, traverse fan-in of destination in SoC 202

Found Source? 204
YES → Stop traversal 206

NO flip flop found > # cycle for source to propagate to desitnation? 208
YES → Stop traversal 210

NO

Add node to graph 212

Is all destination traversed? 214
NO

YES

For every source present in graph 216

Does source have a driver? 218

YES

Inject mux at source in graph 220

Associate each property with corresponding mux enable 222

Output graph is Reduced Formal Model 230

*FIG. 11*

CREATION OF REDUCED FORMAL MODEL FOR SCALABLE SYSTEM-ON-CHIP (SOC) LEVEL CONNECTIVITY VERIFICATION

RELATED APPLICATION

The present application claims benefit under 35 USC 119(e) of U.S. Patent Application No. 63/287,011, filed Dec. 7, 2021, the content of which is incorporated herein by reference in its entirety.

TECHNICAL FIELD

The present disclosure generally relates to a circuit design connectivity verification system. More particularly, the present disclosure is related to creating a formal model for scalable system-on-chip (SoC) connectivity verification.

BACKGROUND

To ensure desired operation of an SoC, the connections in the SoC design are verified prior to its manufacturing. Devising simulation patterns that can uncover every possible defect in an SoC may be a challenge. Formal verification exhaustively explores the mathematical representation of the design to detect all possible incorrect functions. However, the state space explosion caused by design complexity is challenging. Since an SoC may include several millions of sequential logic elements, the complexity in verifying a SoC is even more computationally intensive and time consuming.

SUMMARY

A method of verifying connectivity in a circuit design, in accordance with one embodiment of the present disclosure, includes, in part, receiving a netlist of the circuit design; designating a plurality of destination nodes associated with the netlist; for each of the plurality of destination nodes, identifying one or more source nodes that are traversed from the destination node; for each source node identified as traversed from the destination node: transforming the netlist by including a first multiplexer having a first input terminal receiving a first variable logic value and an output terminal coupled to the source node; and enabling the first multiplexer to pass the first variable value to the destination node from the source node in order to check for connectivity between the source node and the destination node.

In one embodiment, the method further includes, in part, for each source node identified as being traversed from the destination node: further transforming the netlist by including a second multiplexer having a first input terminal receiving a second variable logic value if the source node is determined as being driven by a first node, wherein an output terminal of the second multiplexer is coupled to the first node; and enabling the second multiplexer to pass the second variable value to the destination node via the first node and the source node to check for connectivity between the first node and the destination node.

In one embodiment, the method further includes, in part, inhibiting the first multiplexer from passing the first variable when the second multiplexer is enabled to pass the second variable. In one embodiment, the method further includes, in part, assigning a first property identifier to the connectivity check between the source node and the destination node.

In one embodiment, the first property identifier has a single bit defining an enable value of the first multiplexer. In one embodiment, the first multiplexer is a 2-to-1 multiplexer. In one embodiment, the method further includes, in part, for each of the plurality of destination nodes, determining a number of flip-flops disposed along a path to the destination node; and discarding the flip-flops if the number of flip-flops exceeds a threshold value.

A system, in accordance with one embodiment of the present disclosure, includes, in part, a memory storing instructions; and a processor, coupled with the memory and configured to execute the instructions. The instructions when executed causing the processor to receive a netlist of the circuit design; designate a plurality of destination nodes associated with the netlist; for each of the plurality of destination nodes, identify one or more source nodes that are traversed from the destination node; for each source node identified as traversed from the destination node: transform the netlist by including a first multiplexer having a first input terminal receiving a first variable logic value and an output terminal coupled to the source node; and enable the first multiplexer to pass the first variable value to the destination node from the source node in order to check for connectivity between the source node and the destination node.

In one embodiment, the instructions further cause the processor to: for each source node identified as traversed from the destination node: further transform the netlist by including a second multiplexer having a first input terminal receiving a second variable logic value if the source node is determined as being driven by a first node, wherein an output terminal of the second multiplexer is coupled to the first node; and enable the second multiplexer to pass the second variable value to the destination node via the first node and the source node to check for connectivity between the first node and the destination node.

In one embodiment, the instructions further cause the processor to inhibit the first multiplexer from passing the first variable when the second multiplexer is enabled to pass the second variable. In one embodiment, the instructions further cause the processor to assign a first property identifier to the connectivity check between the source node and the destination node.

In one embodiment, the first property identifier has a single bit defining an enable value of the first multiplexer. In one embodiment, the first multiplexer is a 2-to-1 multiplexer. In one embodiment, the instructions further cause the processor to: for each of the plurality of destination nodes, determine a number of flip-flops disposed along a path to the destination node; and discard the flip-flops if the number of flip-flops exceeds a threshold value.

A non-transitory computer readable medium, in accordance with one embodiment of the present disclosure, includes, in part, stored instructions, which when executed by a processor, cause the processor to receive a netlist of the circuit design; designate a plurality of destination nodes associated with the netlist; for each of the plurality of destination nodes, identify one or more source nodes that are traversed from the destination node; for each source node identified as traversed from the destination node: transform the netlist by including a first multiplexer having a first input terminal receiving a first variable logic value and an output terminal coupled to the source node; and enable the first multiplexer to pass the first variable value to the destination node from the source node in order to check for connectivity between the source node and the destination node.

In one embodiment, the instructions further cause the processor to: for each source node identified as being traversed from the destination node: further transform the netlist by including a second multiplexer having a first input terminal receiving a second variable logic value if the source node is determined as being driven by a first node, wherein an output terminal of the second multiplexer is coupled to the first node; and enable the second multiplexer to pass the second variable value to the destination node via the first node and the source node to check for connectivity between the first node and the destination node.

In one embodiment, the instructions further cause the processor to inhibit the first multiplexer from passing the first variable when the second multiplexer is enabled to pass the second variable. In one embodiment, the instructions further cause the processor to assign a first property identifier to the connectivity check between the source node and the destination node. In one embodiment, the first property identifier has a single bit defining an enable value of the first multiplexer. In one embodiment, the first multiplexers is a 2-to-1 multiplexer.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 11 is a flowchart for verifying connectivity, in accordance with one embodiment of the present disclosure.

DETAILED DESCRIPTION

Aspects of the present disclosure relate to a system and method for creating a formal model for scalable SoC level connectivity verification.

To verify the connectivity of an SoC design, the entire SoC design may be provided as an input to a verification system, thereby complicating and lengthening the duration of the verification process. In accordance with embodiments of the present disclosure, to create a desired and reduced formal model for verifying the connectivity of a circuit, such as a SoC circuit, only portions of the circuit that require verification are provided as input to the present verification system. Because the number of inputs to the present verification system is reduced, embodiments of the present disclosure advantageously take less time to verify the connectivity. Technical advantages of the present disclosure, include, but are not limited to, substantially reduced verification time, memory requirement, and the cost associated with verifying the connectivity of a circuit.

The verification seeks to prove conditional device connectivity by determining whether a structural connection exists between a source node and a destination node in the circuit design. Such checks are directional because they look for signal value propagation from the source node to the destination node. The verification may thus be considered as proving a property of the form:

$$(enable\ expressions) | \rightarrow (source == destination) \qquad (1)$$

The above expression (1) seeks to show whether the signal from the source node propagates to the destination node if the "enable expressions" is asserted. The "enable expression" is understood to refer to a logic condition that if evaluated as being "true", will cause the signal to propagate from the source node to the destination node. The SoC design and the connections that require verification are supplied to a method and system, in accordance with embodiments of the present disclosure, by, for example, a verification engineer or a user. Embodiments of the present disclosure transform the SoC design to what is referred to herein as a reduced formal model. The reduced formal model is subsequently processed by a verification system (alternatively referred to herein verification engine).

Figure 1:
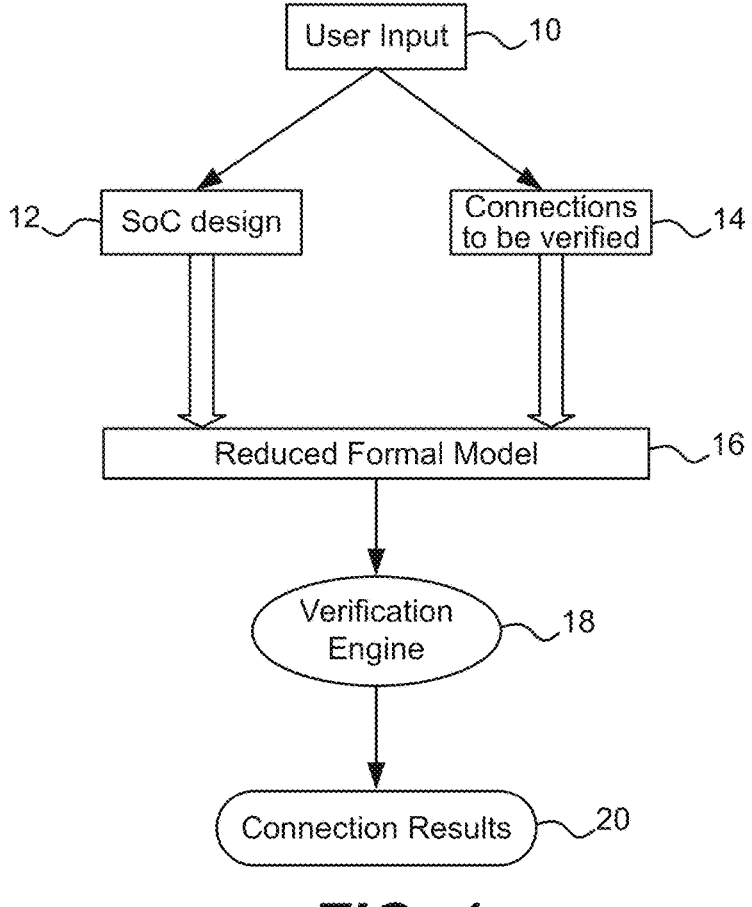
FIG. 1 shows a high-level process flow for verifying connectivity of a circuit, in accordance with one embodiment of the present disclosure.

FIG. 1 is a process flow for performing connectivity check, in accordance with one embodiment of the present disclosure. User input 10 for performing a connectivity check includes an SoC design 12 and its associated connections 14. The SoC design is transformed to a reduced formal model 16. Verification engine 18 receives the reduced formal model 16 and performs connectivity check to generate connections results 20. Verification engine 18 may be a processor executing a series of instructions in the form of computer-readable code stored in a memory, as described further with reference to FIG. 20.

Figure 2:
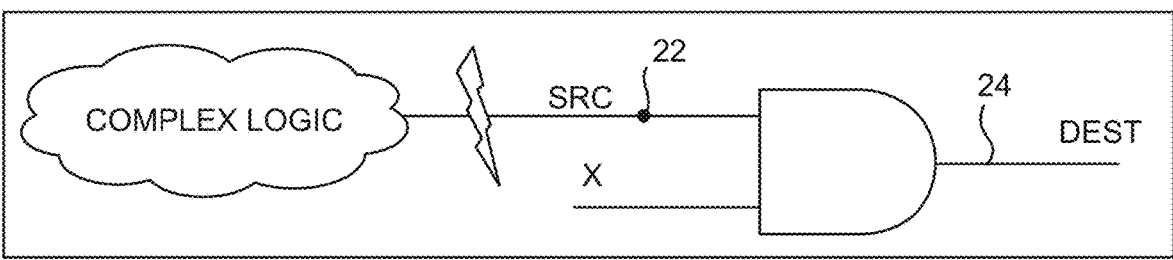
FIG. 2 shows a logic block driving an input terminal of an AND gate.
Figure 3:
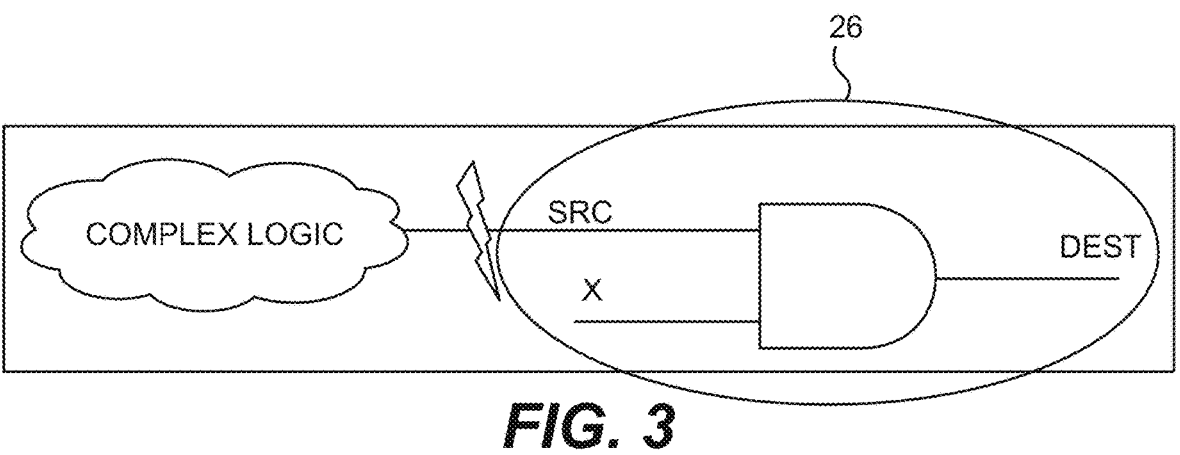
FIG. 3 shows a portion of FIG. 2 identified as having no bearing in verifying connectivity of the AND gate of FIG. 2.

FIG. 2 shows a logic block driving an input terminal of an AND gate. In this example, the connectivity between a source node (SRC) 22 and a destination node (DEST) 24 is to be verified. A node is understood to refer to a wire or a signal carried by the wire in the circuit design undergoing verification. Since the verification involves determining whether source node 22 is connected to destination node 24, any logic circuit (e.g., a combination of logic gates) beyond (e.g., preceding) source node 22 has no bearing on this verification. A connection between a source node and a destination node refers to an electrical coupling (an electrically conductive path) between the source node and the destination node via a wire or a logic element. FIG. 3 identifies corresponding portion 26 of FIG. 2 which is provided as input to a verification engine to check for connectivity between source node 22 and destination node 24, in accordance with one embodiment of the present disclosure.

Figure 4A:
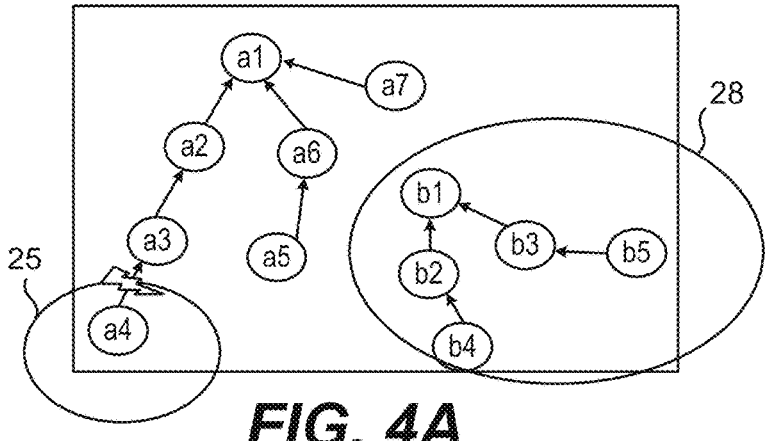
FIG. 4A shows multiple nodes of a circuit in a graph format, in accordance with one embodiment of the present disclosure.
Figure 4B:
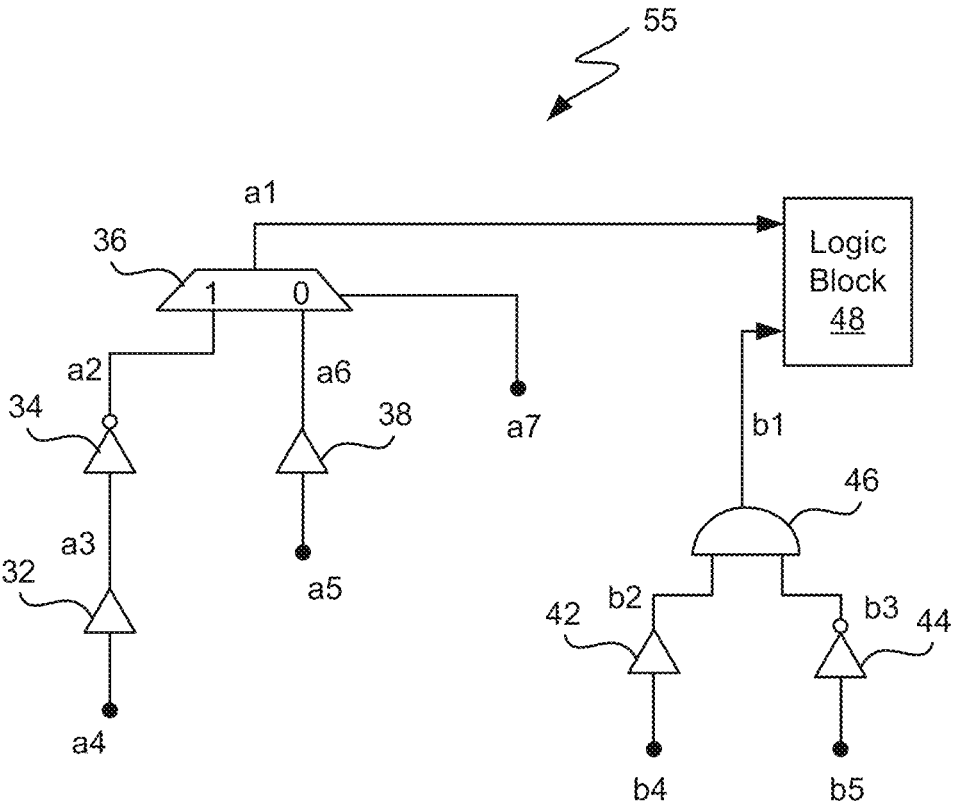
FIG. 4B is an example of a circuit having a node connection graph shown in FIG. 4A.

FIG. 4A shows multiple nodes of a circuit in a graph format, in accordance with one embodiment of the present disclosure. The circuit is represented as a graph having nodes $\{a_i, b_j\}$, where i is an index ranging from 1 to 7, and j is an index ranging from 1 to 5. FIG. 4B is an example of a logic circuit 55 whose nodes are shown in a graph format in FIG. 4A. Logic circuit 55 is shown as including buffers 32, 38, 42, inverters 34, 44, multiplexer 36, AND gate 46 and a logic block 48. In one example, a target connectivity property "conn1" is defined between source node a3 and destination node a1. A connectivity property seeks to prove the existence of a connection between a pair of nodes as shown in expression (1) above. The verification engine may verify whether node a3 is always connected to node a1 by performing formal verification based checking whether the source node and the destination node satisfy the connectivity property "conn1".

To validate property "conn1", portions 25 and 28 of FIG. 4 are discarded as they have no bearing on the target connectivity. In other words, all $b_j$ nodes that don't fall in the cone of influence of a1 are discarded. A cone of influence of a node is understood to refer to a group of signals that are in the fan-in of the node and can change the signal at the node. Similarly, node a4 is discarded. Since the verification of connectivity is carried out from node a3, any connection beyond node a3, i.e., the source node in this example, has no impact on this verification. Therefore, only the reduced circuit having nodes $\{a1, a2, a3, a5, a6, a7\}$ is supplied as an input to the verification engine to check for connectivity, in accordance with embodiments of the present disclosure.

Figure 5:
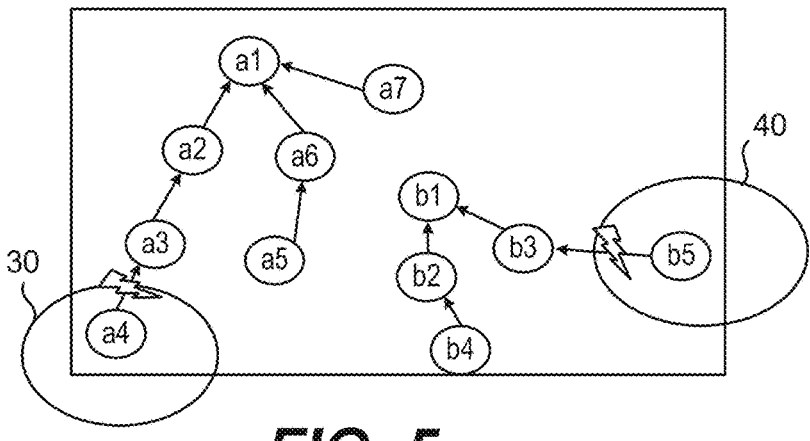
FIG. 5 shows multiple nodes of a circuit in another graph format, in accordance with one embodiment of the present disclosure.

FIG. 5 shows multiple nodes of a circuit in another graph format, in accordance with one embodiment of the present disclosure. Nodes $\{a_i, b_j\}$ represent signals of another example of a circuit design, where i is an index ranging from 1 to 7, and j is an index ranging from 1 to 5. In one example, connectivity property "conn2" verifies the connectivity between source node a3 and destination node a1. Connectivity property "conn3" verifies the connectivity between source node b3 and destination node b1.

For verification of these two properties, regions 30 and 40 of FIG. 5 are discarded. Node b5 is discarded since verification of connectivity is carried out from node b3 as the source node. Therefore, connections beyond node b3 are irrelevant in this verification. Similarly, since verification of connectivity is carried out from node a3, connections beyond node a3 as the source node, are irrelevant in this verification. Node a4 is therefore discarded. The union of nodes $\{a1, a2, a3, a5, a6, a7\}$ and $\{b1, b2, b3, b4\}$, namely $\{a1, a2, a3, a5, a6, a7, b1, b2, b3, b4\}$ is provided as an input to the verification system, in accordance with embodiments of the present disclosure.

Assume, for example, that there are 'n' sequential elements (e.g., flip-flops) disposed between a source node and a destination node, where n is an integer equal to or greater than one. The present verification system may allow a value of the source node to propagate to the destination node within 'n' cycles, by capturing the fan-in logic of the destination node and discarding connections beyond 'n' cycles.

Figure 6:
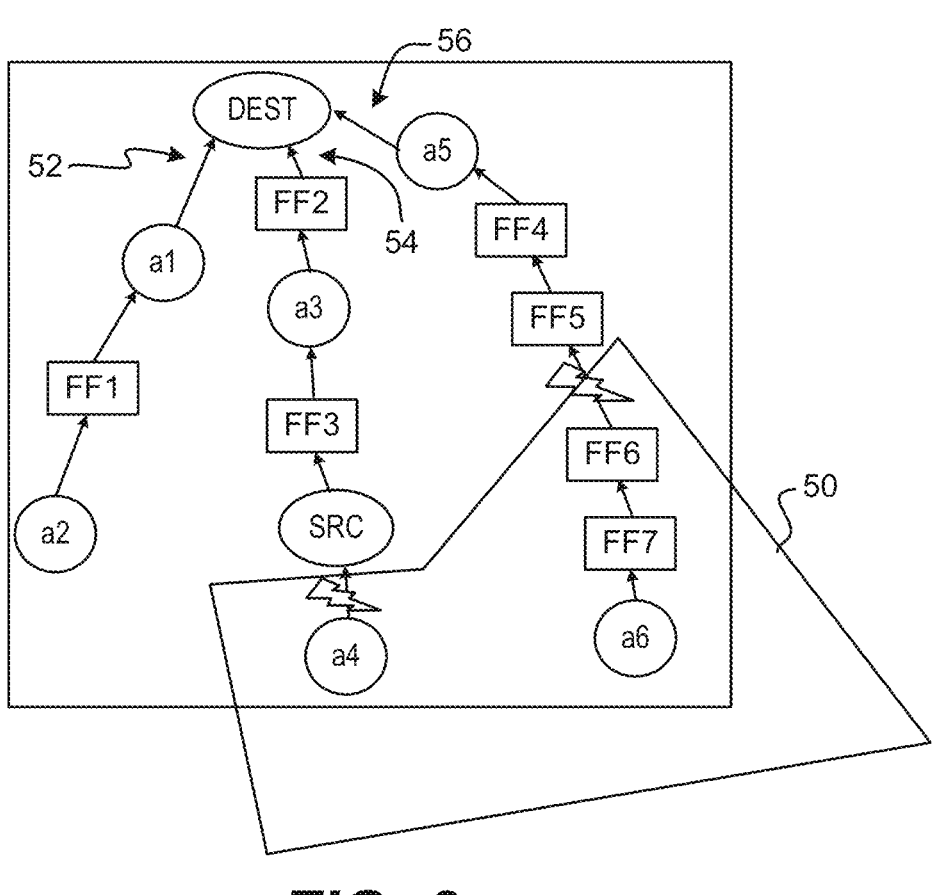
FIG. 6 shows multiple nodes of a circuit that includes sequential elements in a graph format, in accordance with one embodiment of the present disclosure.

FIG. 6 shows multiple nodes of a circuit that includes sequential elements in a graph format, in accordance with one embodiment of the present disclosure. The present verification system may verify the connectivity between a source node SRC to a destination node DEST. There are three paths to the destination node DEST shown as paths 52, 54 and 56. The leftmost path 52 is covered from node a2 to node DEST with a delay of 1 cycle caused by flip-flop FF1. The middle path 54 has a delay of 2 cycles caused by flip-flops FF3 and FF2 from the source node SRC to node DEST, as shown. Accordingly, middle path 54 is covered from node SRC to node DEST. In the rightmost path 56, all logic and connections beyond the second flip-flop FF5 are discarded, in accordance with embodiments of the present disclosure, since the connectivity check requires that the value of the source node propagate to the destination node in two clock cycles. Therefore, nodes corresponding to a3 and flip-flops FF6 and FF7, collectively identified in region 50, are discarded as the nodes in region 50 are beyond 2 clock cycles to the destination node.

Figure 7:
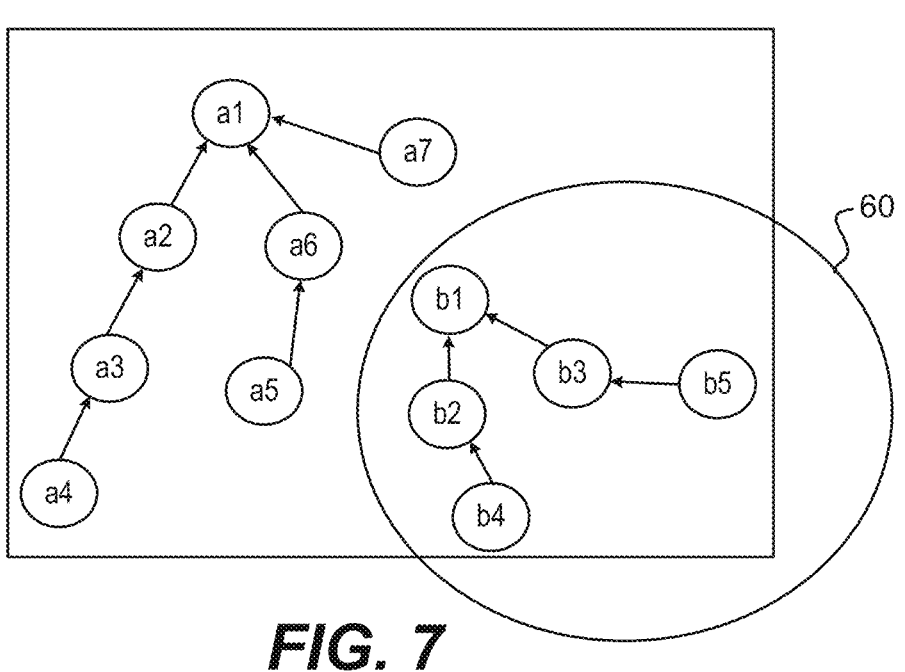
FIG. 7 shows multiple nodes of a circuit in another graph format.

FIG. 7 shows multiple nodes of a circuit in another graph format. In this example, nodes $\{a_i, b_j\}$ represent signals of another example of a circuit design, where i is an index varying from 1 to 7 and j is an index varying from 1 to 5. The connectivity property "conn1" checks for connectivity between the source node a3 and the destination node a1, and the connectivity property "conn2" checks for connectivity between the source node a4 and the destination node a1 as defined further below:

Connectivity property conn1:: {source-{a3}, destination-{a1}}

Connectivity property conn2:: {source-{a4}, destination-{a1}}

For verification of the two connectivity properties "conn1" and "conn2", region 60 of FIG. 7 that include nodes $b_1, b_2, b_3, b_4, b_5$ is discarded, as the nodes in regions 60 are not in the path of the designated connectivity checks "conn1" and "conn2". Therefore, to perform the above connectivity checks, the union of node $\{a1, a2, a3, a5, a6, a7\}$ and $\{a1, a2, a3, a4, a5, a6, a7\}$, i.e., $\{a1, a2, a3, a4, a5, a6, a7\}$ is provided as an input to the present verification engine.

In the example described with reference to FIG. 7, when the connectivity property "conn1" is performed, the driver of node a3, which is node a4, is not considered. However, for the connectivity property "conn2", node a4 is also provided to the verification engines as a result of performing the union operation described above.

Figure 8:
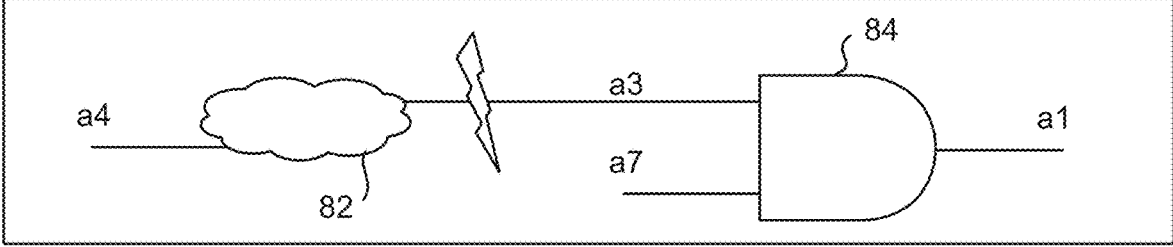
FIG. 8 shows an input terminal of an AND gate driven by a logic block.

Consider the circuit shown in FIG. 8, in which only the connectivity from the source node a3 to the destination node a1, defined as "conn1", is a target of verification. Nodes a3 and a4 are input nodes to AND gate 84 that generates a signal at its output node a1. The connectivity verification results in a failure as the value at node a1 depends also on the value at node a7. For example, even if source node a3 is not connected to node a1, node a1 receives a logic value 0 if node a7 is set to logic value 0, regardless of the logic value generated by logic block 82.

Figure 9:
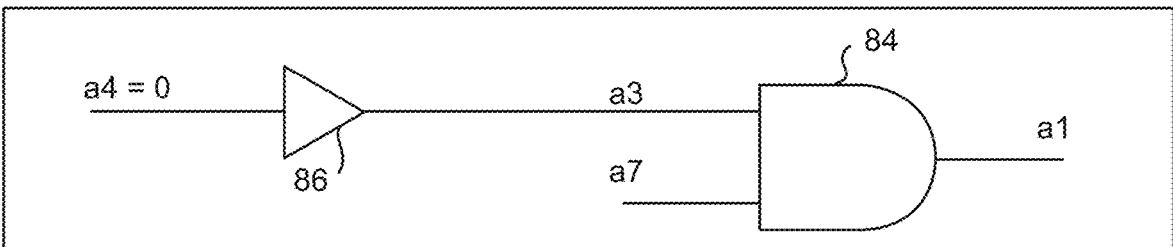
FIG. 9 shows an input terminal of an AND gate being driven by an inverter.

FIG. 9 shows the same circuit as that shown in FIG. 8 except that FIG. 9 includes a buffer 86 (in place of logic block 82 of FIG. 8) that is shown as receiving a constant value of logic 0 Assume that the following connectivity checks "conn1" and "conn4", as defined below, are to be performed for the circuit shown in FIG. 9:

Connectivity property conn1: {source (a3), destination (a1)}

Connectivity property conn4: {source (a4), destination (a1)}

As shown in FIG. 9, node a3 is physically connected to node a1, and therefore a logic value of 0 from node a4 propagates to node a1 from node a3 irrespective of value at node a7. The connectivity check "conn1" therefore passes the verification test because the values at nodes a1 and a3 match. Hence, the property status of "conn1" which failed in scenario 1, passes in scenario 2, thus leading to inconsistency. To overcome such inconsistency, verification of a connectivity check, in accordance with embodiments of the present disclosure, is made independent of other connectivity checks.

In accordance with one aspect of the present disclosure, to perform a connectivity check, a circuit is transformed to enable a variable signal to be selectively applied to each source node using, for example, a multiplexer. For example, FIG. 9 is transformed to include a multiplexer (mux) coupled to each of nodes a3 and a4, as shown in the transformed circuit shown in FIG. 10. Mux 92 is shown as being coupled to node a3, and mux 94 is shown as being coupled to node a4. A first input terminal of mux 92 receives the output of buffer 86, and a second input of mux 92 receives a first variable value "free_var_1", which is a variable that may be set by the verification system to logic 1 and/or 0 to check for connectivity. The select terminal of mux 92 receives signal "enable1", and the output of mux 92 is coupled to node a3. A first input terminal of mux 94 is coupled to node "Driver_a4", a second input of mux 94 receives a second variable value "free_var_2". The select terminal of mux 94 receives signal "enable4", and the output of mux 94 is coupled to node a4.

Figure 10:
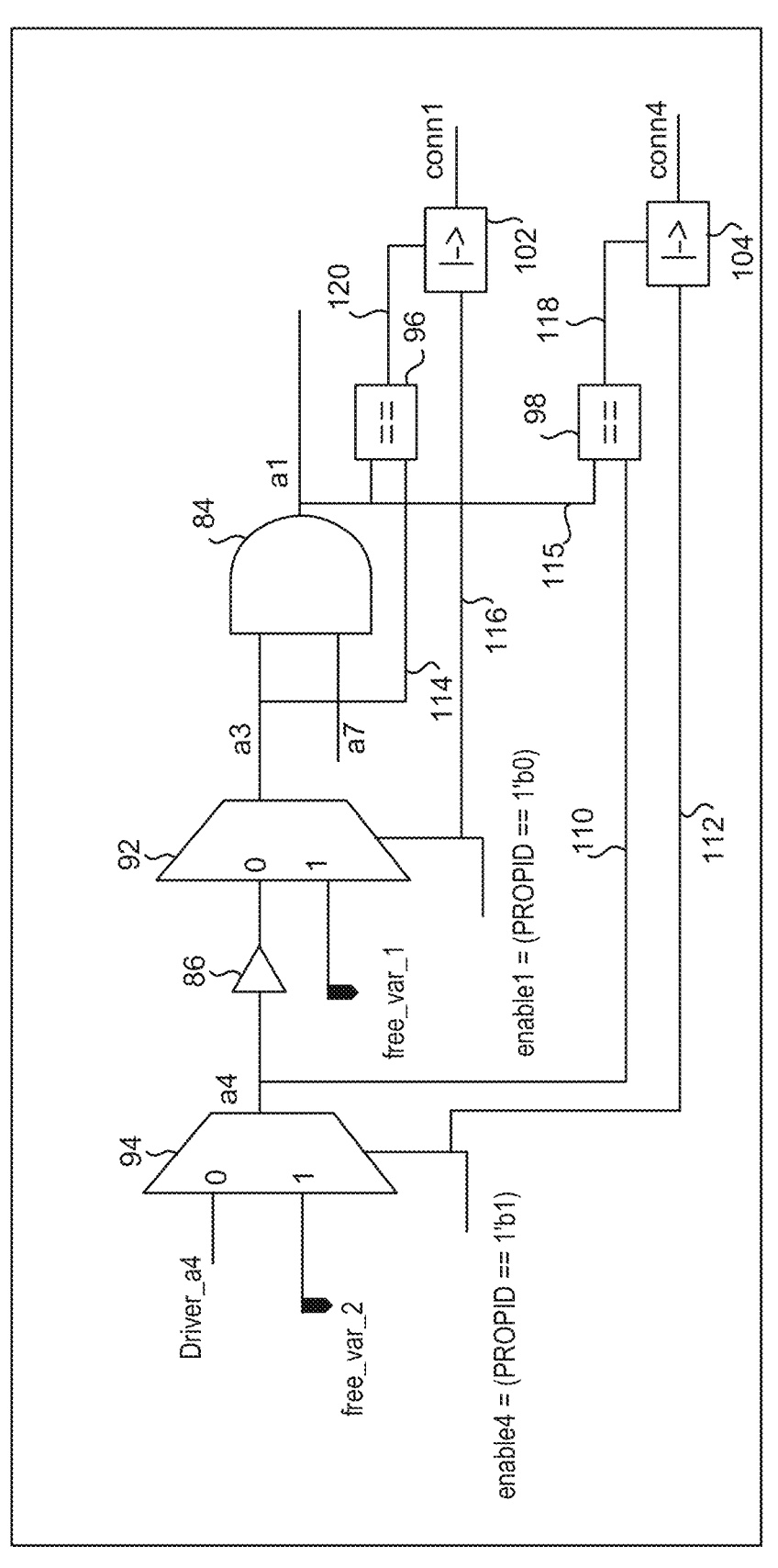
FIG. 10 shows the circuit of FIG. 9 after the circuit is transformed to perform connectivity verification, in accordance with one embodiment of the present disclosure.

The multiplexers are configured to determine whether a node in the original untransformed circuit (i.e., FIG. 9 in this example) is driven selectively by a variable or a node in the original circuit. Each connectivity property is identified by a property identifier (ID). FIG. 10 shows the circuit of FIG. 9 after the circuit is transformed to perform connectivity verification, in accordance with one embodiment of the present disclosure. For each of the two properties "conn1" and "conn4" under consideration in FIG. 10, a one-bit property identifier (ID) register, namely PROPID, is used. Each register value therefore indicates an associated property that is to be verified. The connection properties "conn1" and "conn4" are verified by enabling the associated multiplexers 92, 94 to selectively apply variables free_var_1, and free_var_2 to node a3 and a4 respectively. When determining connectivity check "conn1", a logic value of 1 is applied to select terminal enable1 of mux 92 thereby to transfer the value of variable free_var_1 to the output of multiplexer 92—which is connected to node a3. Similarly, when determining connectivity check, "conn4", a logic value of 1 is applied to select terminal enable4 of mux 94 thereby to transfer the value of variable free_var_2 to the output of multiplexer 94—which is connected to node a4.

As shown in FIG. 10, property "conn1" is instrumented as ((PROPID==1'b0) |→(a1==a3)), indicated by lines 114, 115, 116, and 120. When the verification engine assigns a logic value 0 to the PROPID, the enabling condition for "enable1", namely "PROPID==1'b0" evaluates to "true", in which case "enable1" is set to 1. This causes node a3 to receive the value defined by "free_var_1" and the output of AND gate 84 at node a1 to receive the value at node a3. If both inputs to equality checker 96 are the same, equality checker 96 generates a logic value of 1 indicative of a "true" for the equality check "a1==a3" if node a7 is set to "1'b1". Therefore, connectivity checker 102 "Conn1" (shown as an output of "imply" notation "|→" 102) returns a "valid" result (indicating the connection is valid) if the output of equality checker 96 is asserted while "enable1" is 1. In one embodiment, equality checkers 96 and 98, as well as connectivity checkers 102, 104 may be implemented as hardware logic blocks and added to the circuit being verified. In other embodiments, equality checkers 96 and 98, as well as connectivity checkers 102, 104 may be implemented in software (in the form of instructions executed by a processor) by the verification system.

Similarly, property "conn4" is instrumented as ((PROPID==1'b1)|→(a1 a4)), indicated by lines 110, 112, 115, and 118. When the verification engine assigns a logic value 1 to the PROPID, the enabling condition for "enable4", namely "PROPID==1'b1" evaluates to "true", in which case "enable4" is set to 1 and "enable1" is set to 0. This causes the value of "free_var_2" to be delivered to the input of buffer 86 at node a4 via mux 94, and the value at node a4 to be delivered to node a3 via mux 92. In other words, the value at node a4 is delivered to node a1 via node a3 when the PROPID is set to 1. Equality checker 98 compares the value of node a1, received via line 115, to the value of node a4, received via line 110, and returns a logic value representative of a "true" if these two values match. If the output of equality checker is a "true" while "enable4" is set to a logic 1, connectivity checker 104 returns a "valid". As seen from the above example, the two connectivity checkers operate on two different connectivity check even though a single netlist (model) is received as input. It is understood that when equality checkers 96 and 98, and connectivity checkers 102, 104 are implemented in software by the verification system, lines 110, 112, 114, 115, 116, 118, and 120 are not included in the circuit design and are only shown for purposes of describing the verification.

Embodiments of the present disclosure therefore avoid generating multiple copies of a design and check for all desired connectivity properties in a single transformed design. The following represents, in a pseudo-code format, the connectivity checks "conn1", "conn4", and the operations performed by the multiplexers and the equality checkers described above with reference to FIG. 10.

```
// Two connectivity properties (conn1 and conn4)
// before mux injection
property conn1: a1 == a3
property conn4: a1 == a4
// internally generated free variables
wire free_var_1
wire free_var_2;
// 1 bit register to indicate corresponding property ID
reg PROPID;
assign enable1 = PROPID == 1'b0; // prop ID for conn1
assign enable4 = PROPID == 1'b1; // prop ID for conn4
```

-continued

```
assign a3 = (enable1 & free_var_1) | (~enable1 & a4); // Injected mux for conn1
assign a4 = (enable4 & free_var_2) | (~enable4 & driver_ad); // Injected mux for conn4
// after mux injection
property conn1: enable1 |-> (a1 == a3)
property conn4: enable4 |-> (a1 == a4)
```

The use of a 2-to-1 multiplexer at the source of each connectivity checker ensures that in the course of performing a verification, any logic present in the fan-in of a source node that does not influence the connection status is not included in the verification. The use of multiplexers, in accordance with embodiments of the present disclosure, overcomes any inconsistency in results while ensuring quick convergence.

FIG. 11 is a flowchart for verifying connectivity, in accordance with one embodiment of the present disclosure. At 200, the SoC design and the source node and destination node of the design that are to be verified are received. Moreover, a node connection graph, such as that shown in FIG. 4, is created for the design. At 202, the fan-in cone of each destination node in the connection list is traversed in the connection graph to identify the associated source node. If the source node is found at 204, the traversal ends at 206 and the flow returns to 214.

If the source node is not found at 204, then at 208, a determination is made as to whether the number of flip-flops found during the traversal to locate the source is greater than the number of clock cycles specified for the signal to propagate from the source node to the destination node. If the number of flip-flops found is greater than the number of clock cycles specified for the signal to propagate from the source node to the destination node, then the traversal ends at 210 and the flow moves to 214. If the number of flip-flops found is not greater than the number of clock cycles specified for the signal to propagate from the source node to the destination node, then the node is added to the graph at 212.

Subsequently, if at 214, it is determined that not all destination nodes have been traversed at 216, the flow returns to 202. If at 214, it is determined that all destination nodes have been traversed, then for every source node that has been located at 216, a determination is made at 218 as to whether the source node has a driver node. If at 218, it is determined that the source node has a driver node, then at 220, a multiplexer is injected at the source node. A property ID, as shown and described above with respect to FIG. 10 is then associated with the enable terminal of each injected multiplexer at 222. The result at 230 is an output graph of a reduced formal model for the connectivity check, in accordance with embodiments of the present disclosure. If there are N connection property IDs, a property register ID of size $\log_2 N$ may be used, where N is an integer equal to or greater than 2. The following is a pseudo-code (2) corresponding to the flowchart shown in FIG. 11.

```
// Create graph from input SoC
1. Create graph with all required nodes
2.    For every destination in connection list
3.       traverse fan-in of destination
4.          If source reached, stop traversal
5.          If #flipflop encountered > #cycles required for source to propagate to
   destination, stop traversal
6.             add node to graph
7. // Mux injection
8. Create a PROPID register of a size rounded up to the nearest integer of (log₂ N) to
   hold N connection IDs // solver internally generates all possible PROPID values
9. For every source in the created graph
10.    If source has a driver
11.       Inject 2X1 mux at source
12.          Mux output is source
13.          Mux input, is driver of source and a free variable
14.          Mux select line is the expression (PROPID == n) expression, where 'n' is
   the number of the connection
15.          When mux is enabled, source is driven by free variable
16.          Final Property is (mux enable |-> (source == destination))          (2)
```

Pseudo-code (2) results in the generation of a reduced formal model for performing connectivity verification in accordance with embodiments of the present disclosure. Embodiments of the present disclosure may be equally used to verify connectivity in paths that include flip-flops, as described above. For example, consider the following Verilog code (3):

```
module top( );
       wire b1, b2, b3, b4, b5;
       assign b1 = b2 | b3;
       assign b2 = b4;
       always (@posedge elk) begin
             b3 <= b5
       end
endmodule                                    (3)
```

Figure 12:
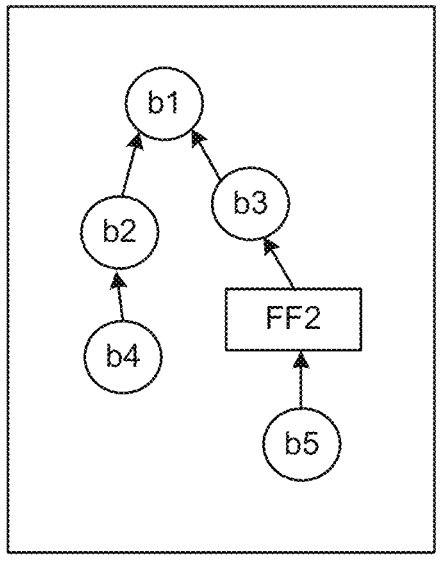
FIG. 12 shows multiple nodes of a circuit in a graph format.

In the above Verilog code (3), the logical OR of signals b2 and b3 is assigned to node b1. Node b2 is driven by node b4, and at every positive edge of clock signal clk, and the value at node b5 is assigned to node b3. FIG. 12 shows multiple nodes of a circuit represented by Verilog code (3) in a graph format. As is seen from FIG. 12, node b1 is driven by nodes b2 and b3; node b4 drives node b2; and node b5 drives node b3 with one flip-flop FF2 disposed between nodes b3 and b5.

FIGS. 13-17 show, in a graph format, various stages of verifying connectivity between nodes of a circuit, in accordance with one exemplary embodiment of the present disclosure. Using the techniques described herein, a reduced model may be created to verify connectivity for all designated connections at once and in a single verification run.

Figure 13:
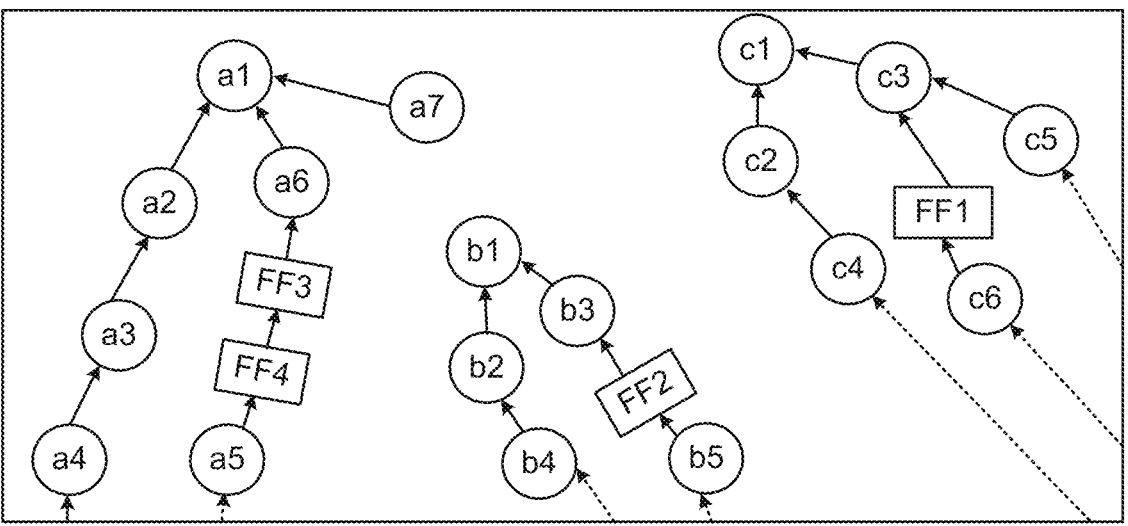
FIGS. 13-17 show various stages of verifying connectivity between nodes of a circuit, in accordance with one exemplary embodiment of the present disclosure.
Figure 14:
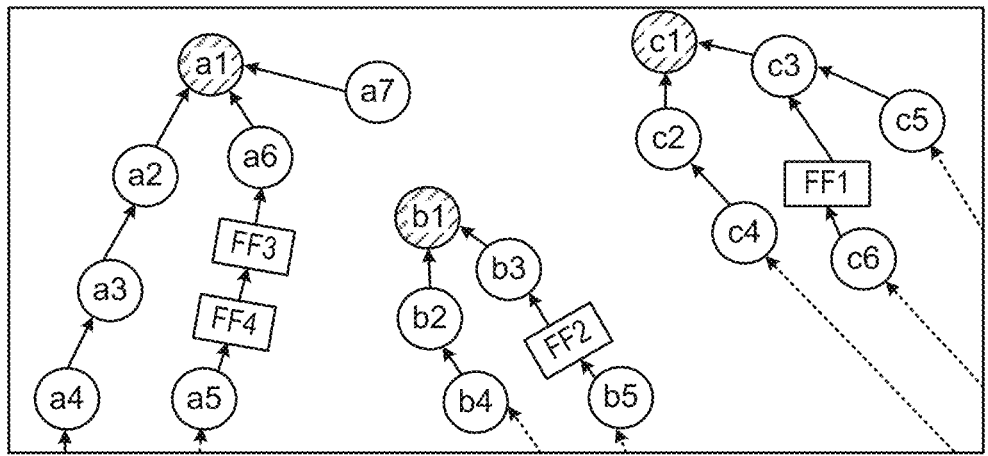
Figure 15:
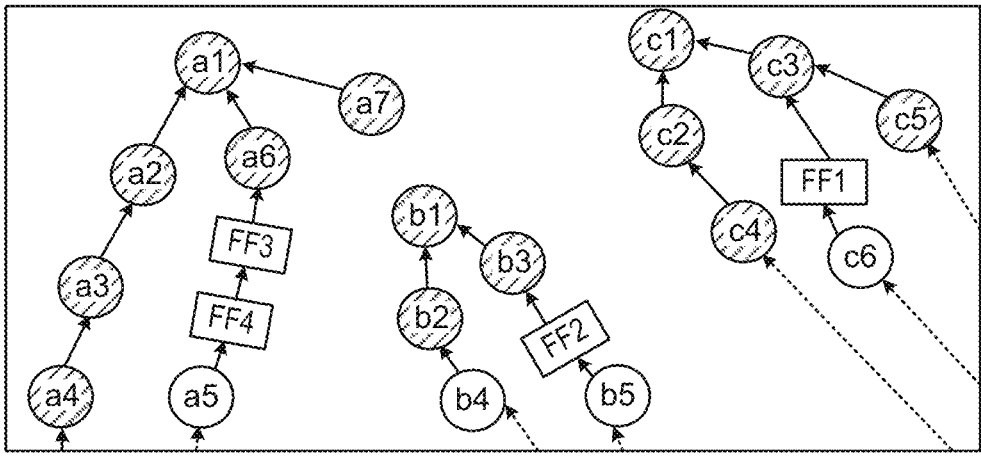
Figure 16:
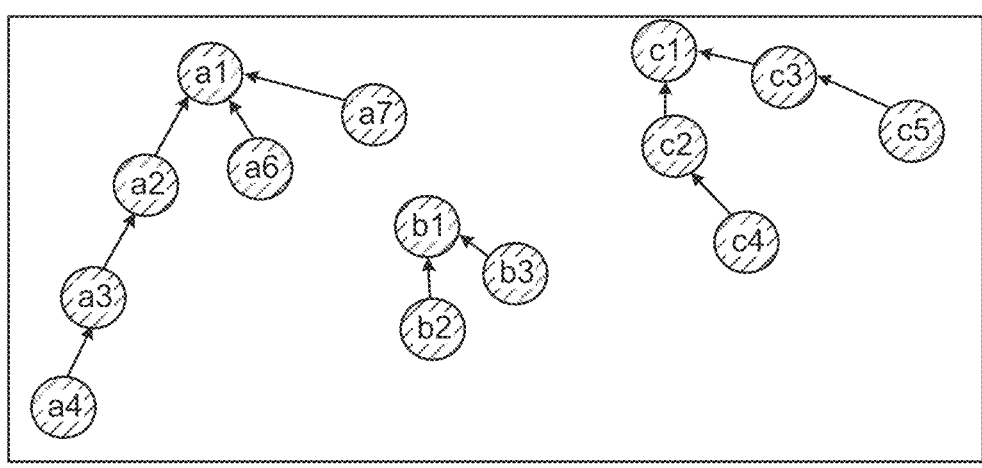

FIG. 13 shows a graph for an SoC that may include a relatively large number of gates (e.g., billions of gates), as represented by the dotted lines. FIG. 13, which corresponds to step 1 of pseudo-code (2) above, shows that a graph of nodes from the netlist is generated. FIG. 14, which corresponds to step 2 of pseudo-code (2), designates every destination node of interest, namely destination nodes a1, b1 and c1. FIG. 15, which corresponds to steps 4-6 of pseudo-code (2), shows that all destination nodes are traversed along their fan-in cones. Because in this example, a depth "0" flip-flop (i.e., 0 clock cycle) is selected for propagation of a signal from a source node to a destination node, flip-flops FF1, FF2, FF3 and FF4 are discarded from further evaluation, as shown in FIG. 16. FIG. 16 corresponds to step 6 of pseudo-code (2) and shows the source nodes, and the nodes that are disposed between the sources node and the destination nodes, are marked and added to the graph. Nodes a4, a6 and a7 are designated as the source nodes for the destination node a1; nodes b2, and b3 are designated as the source nodes for the destination node b1, and nodes c4 and c5 are designated as the source nodes for the destination node c1. The following is the source-destination node pairs that are verified in this example:

source a3-destination a1
source a4-destination a1
source b2-destination b1
source c4-destination c1

Figure 17:
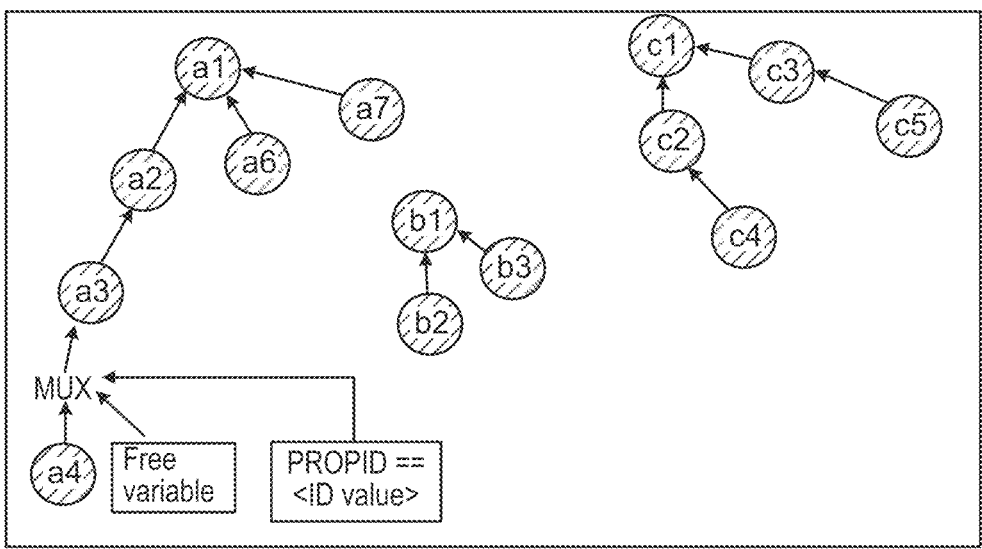

FIG. 17, which corresponds to steps 11-12 of pseudo-code (2), shows a mux is injected at source node a3 since node a3 has a driver node a4. Because the other three source nodes have no driver nodes, no other muxes are shown as being injected.

In one example, the circuit designs considered for the tests are complex SoCs with around 64,000,000 register bits. Verification was first performed using a conventional verification tool. In a verification system, a user specifies the source and destination nodes for each path, the number of delay cycles, if any, along the path, and the conditions under which the path should be verified. As seen from Table I below, a conventional verification tool is not suitable and does not scale to the SoC level. As is also seen from Table I, the verification run times improve significantly using embodiments of the present disclosure.

grated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level description may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 18. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for

TABLE I

|  | No. of connections for verification | Verification using a conventional verification tool | Verification time using embodiments of the present disclosure | Improvement |
|---|---|---|---|---|
| Design 1 | 173981 (103971 proven, 70010 failed) | 35 hrs | 40 mins | 52× |
| Design 2 | 25000 (23241 proven, 1759 failed) | 4 hrs | 12 mins | 20× |
| Design 3 | 1 (1 proven) | 8 hrs | 3 mins | 160× |
| Design 4 | 5428 (5428 proven) | 25 hrs | 29 mins | 53× |
| Design 5 | 2513 (2326 proven, 187 failed) | 6 hrs | 14 mins | 25.5× |
| Design 6 | 447 (441 proven, 6 failed) | 5.6 hr | 3.4 hr | 1.7× |

Figure 18:
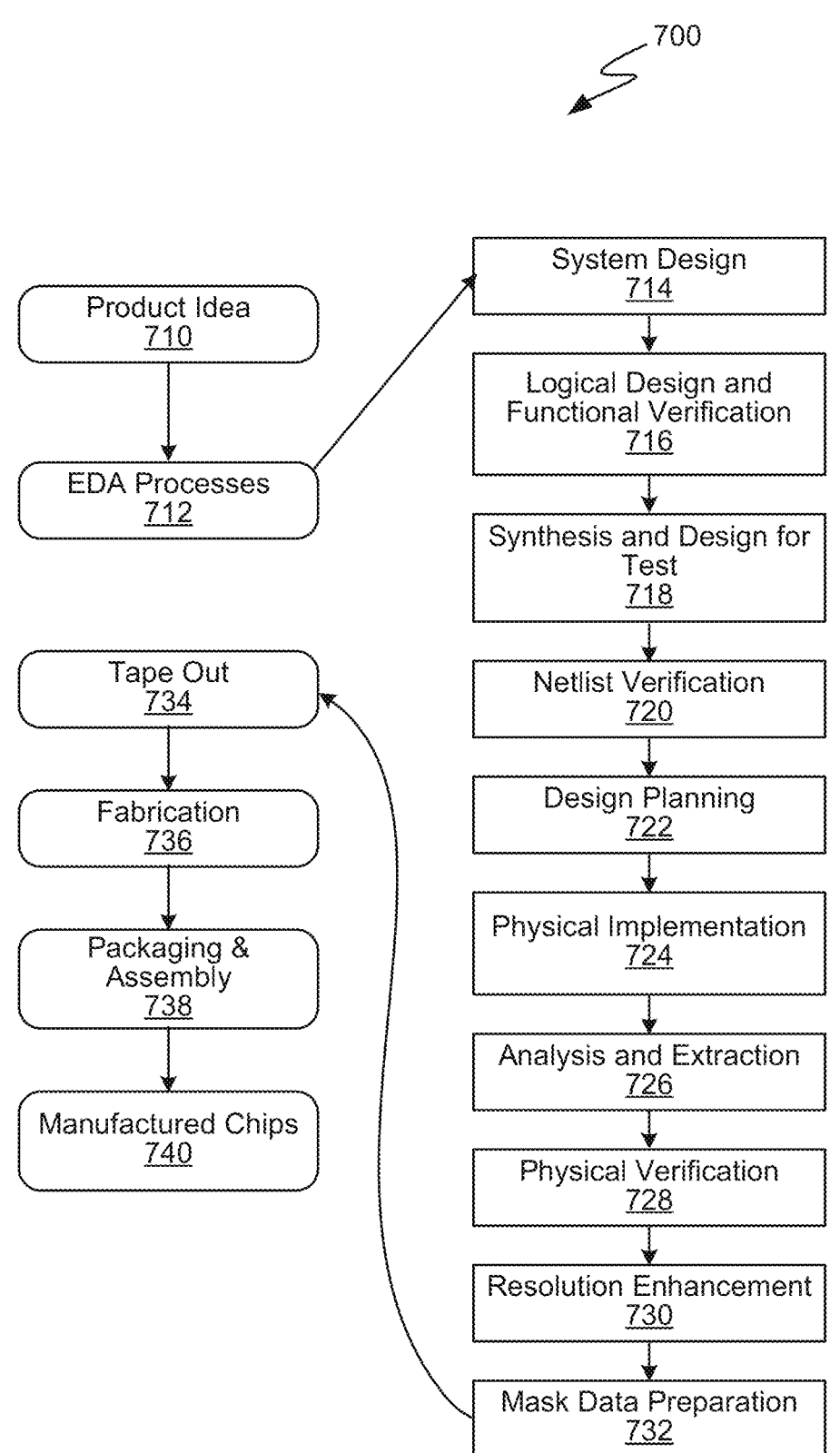
FIG. 18 depicts a flowchart of various processes used during the design and manufacture of an integrated circuit in accordance with some embodiments of the present disclosure.

FIG. 18 illustrates an example set of processes 700 used during the design, verification, and fabrication of an article of manufacture such as an integrated circuit to transform and verify design data and instructions that represent the intefunctional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 20) may be used to store the programs and data structures that are used by some or all of the EDA products described herein, and products used for development of cells for the library and for physical and logical design that use the library.

Figure 19:
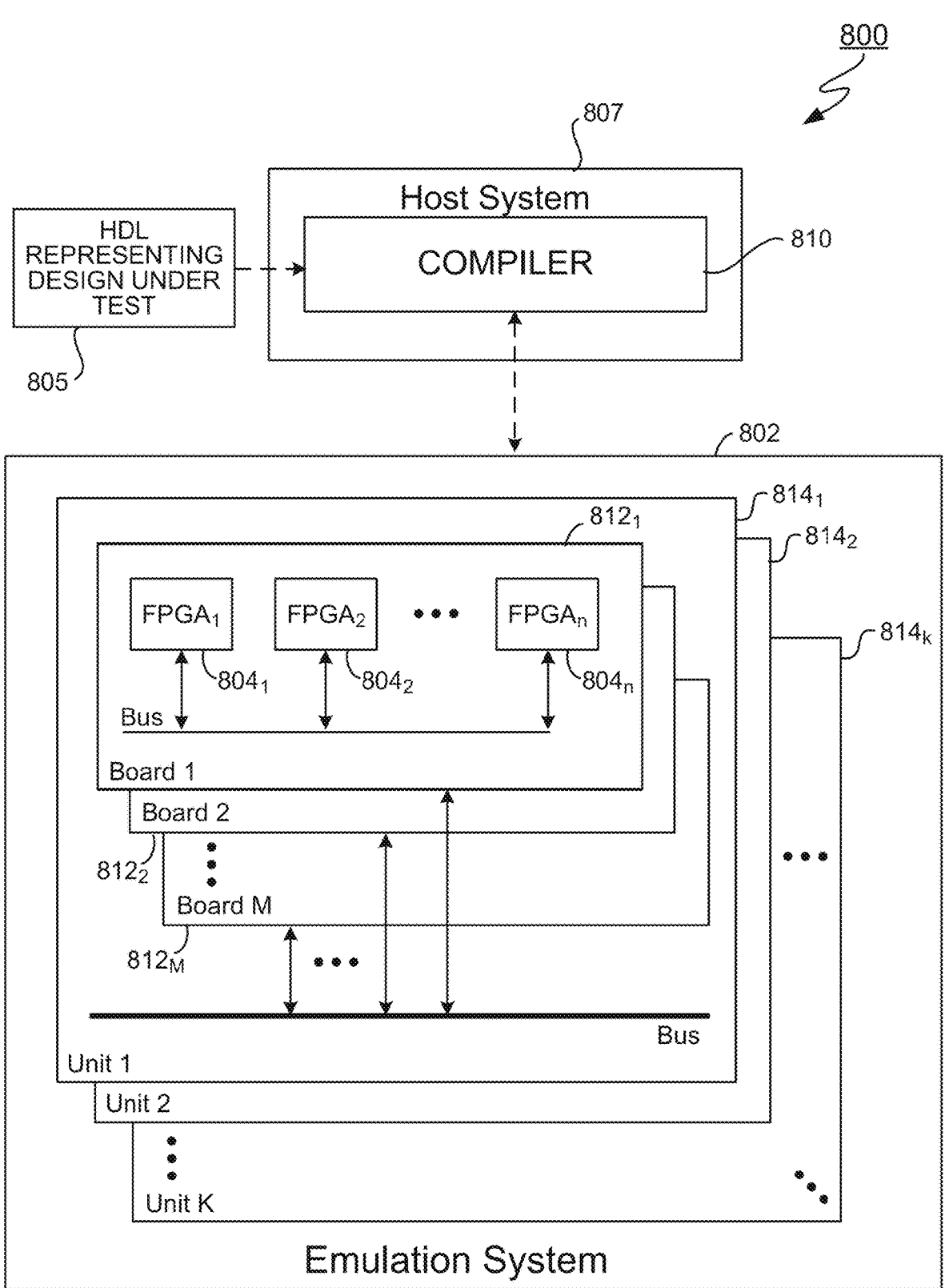
FIG. 19 depicts a diagram of an example emulation system in accordance with some embodiments of the present disclosure.

FIG. 19 depicts a diagram of an example emulation environment 800. An emulation environment 800 may be configured to verify the functionality of the circuit design. The emulation environment 800 may include a host system 807 (e.g., a computer that is part of an EDA system) and an emulation system 802 (e.g., a set of programmable devices such as Field Programmable Gate Arrays (FPGAs) or processors). The host system generates data and information by using a compiler 810 to structure the emulation system to emulate a circuit design. A circuit design to be emulated is also referred to as a Design Under Test ('DUT') where data and information from the emulation are used to verify the functionality of the DUT.

The host system 807 may include one or more processors. In the embodiment where the host system includes multiple processors, the functions described herein as being performed by the host system can be distributed among the multiple processors. The host system 807 may include a compiler 810 to transform specifications written in a description language that represents a DUT and to produce data (e.g., binary data) and information that is used to structure the emulation system 802 to emulate the DUT. The compiler 810 can transform, change, restructure, add new functions to, and/or control the timing of the DUT.

The host system 807 and emulation system 802 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 807 and emulation system 802 can exchange data and information through a third device such as a network server.

The emulation system 802 includes multiple FPGAs (or other modules) such as FPGAs 8041 and 8042 as well as additional FPGAs to 804N. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 802 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $804_1$-$804_N$ may be placed onto one or more boards $812_1$ and $812_2$ as well as additional boards through $812_M$. Multiple boards can be placed into an emulation unit $814_1$. The boards within an emulation unit can be connected using the backplane of the emulation unit or any other types of connections. In addition, multiple emulation units (e.g., $814_1$ and $814_2$ through $814_K$) can be connected to each other by cables or any other means to form a multi-emulation unit system.

For a DUT that is to be emulated, the host system 807 transmits one or more bit files to the emulation system 802. The bit files may specify a description of the DUT and may further specify partitions of the DUT created by the host system 807 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 807 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 807 and/or the compiler 810 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 805 into gate level logic. For a DUT that is to be emulated, the design synthesizer sub-system receives a description of the DUT. If the description of the DUT is fully or partially in HDL (e.g., RTL or other levels of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

Figure 20:
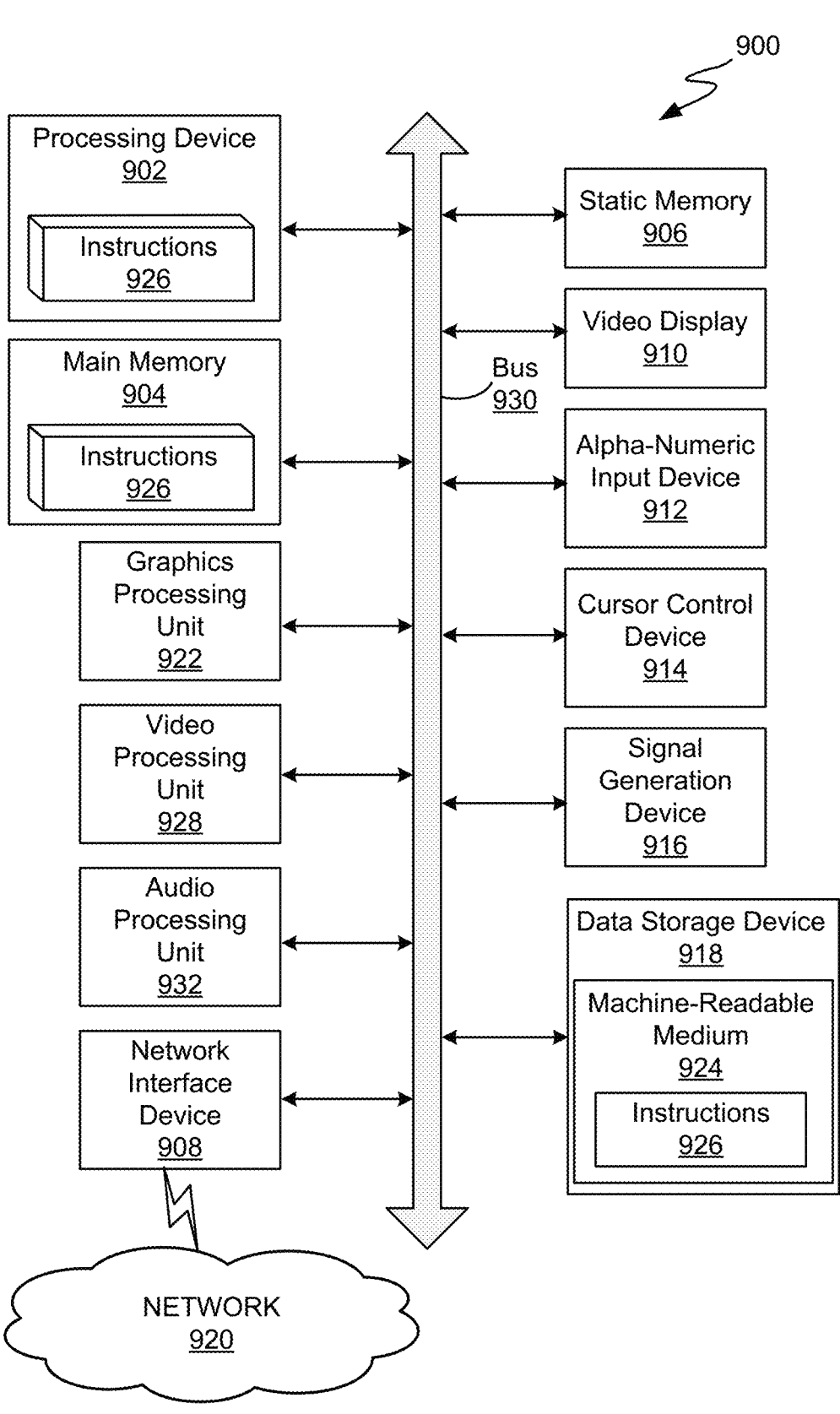
FIG. 20 depicts an diagram of an example computer system in which embodiments of the present disclosure may operate.

FIG. 20 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

FIG. 20 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, and the like.

What is claimed is:

1. A method of verifying connectivity in a circuit design, the method comprising:

receiving a netlist of the circuit design;

designating a plurality of destination nodes associated with the netlist;

for each of the plurality of destination nodes, identifying one or more source nodes that are traversed from the destination node;

for each source node identified as traversed from the destination node:

transforming the netlist by including a first multiplexer having a first input terminal receiving a first variable logic value and an output terminal coupled to the source node; and enabling the first multiplexer to pass the first variable value to the destination node from the source node in order to check for connectivity between the source node and the destination node.

2. The method of claim 1, further comprising:

for each source node identified as being traversed from the destination node:

further transforming the netlist by including a second multiplexer having a first input terminal receiving a second variable logic value if the source node is determined as being driven by a first node, wherein an output terminal of the second multiplexer is coupled to the first node; and enabling the second multiplexer to pass the second variable value to the destination node via the first node and the source node to check for connectivity between the first node and the destination node.

3. The method of claim 2, further comprising:

inhibiting the first multiplexer from passing the first variable when the second multiplexer is enabled to pass the second variable.

4. The method of claim 1, further comprising:

assigning a first property identifier to the connectivity check between the source node and the destination node.

5. The method of claim 4, wherein the first property identifier has a single bit defining an enable value of the first multiplexer.

6. The method of claim 1, wherein the first multiplexer is a 2-to-1 multiplexer.

7. The method of claim 1, further comprising:

for each of the plurality of destination nodes, determining a number of flip-flops disposed along a path to the destination node; and discarding the flip-flops if the number of flip-flops exceeds a threshold value.

8. A system comprising:

a memory storing instructions; and a processor, coupled with the memory and configured to execute the instructions, the instructions when executed causing the processor to:

receive a netlist of the circuit design;

designate a plurality of destination nodes associated with the netlist;

for each of the plurality of destination nodes, identify one or more source nodes that are traversed from the destination node;

for each source node identified as traversed from the destination node:

transform the netlist by including a first multiplexer having a first input terminal receiving a first variable logic value and an output terminal coupled to the source node; and enable the first multiplexer to pass the first variable value to the destination node from the source node in order to check for connectivity between the source node and the destination node.

9. The system of claim 8, wherein the instructions further cause the processor to:

for each source node identified as traversed from the destination node:

further transform the netlist by including a second multiplexer having a first input terminal receiving a second variable logic value if the source node is determined as being driven by a first node, wherein an output terminal of the second multiplexer is coupled to the first node; and enable the second multiplexer to pass the second variable value to the destination node via the first node and the source node to check for connectivity between the first node and the destination node.

10. The system of claim 9, wherein the instructions further cause the processor to:

inhibit the first multiplexer from passing the first variable when the second multiplexer is enabled to pass the second variable.

11. The system of claim 8, wherein the instructions further cause the processor to:

assign a first property identifier to the connectivity check between the source node and the destination node.

12. The system of claim 11, wherein the first property identifier has a single bit defining an enable value of the first multiplexer.

13. The system of claim 8, wherein the first multiplexer is a 2-to-1 multiplexer.

14. The system of claim 8, wherein the instructions further cause the processor to:

for each of the plurality of destination nodes, determine a number of flip-flops disposed along a path to the destination node; and discard the flip-flops if the number of flip-flops exceeds a threshold value.

15. A non-transitory computer readable medium comprising stored instructions, which when executed by a processor, cause the processor to:

receive a netlist of the circuit design;

designate a plurality of destination nodes associated with the netlist;

for each of the plurality of destination nodes, identify one or more source nodes that are traversed from the destination node;

for each source node identified as traversed from the destination node:

transform the netlist by including a first multiplexer having a first input terminal receiving a first variable logic value and an output terminal coupled to the source node; and enable the first multiplexer to pass the first variable value to the destination node from the source node in order to check for connectivity between the source node and the destination node.

16. The non-transitory computer readable medium of claim 15, wherein the instructions further cause the processor to:

for each source node identified as being traversed from the destination node:

further transform the netlist by including a second multiplexer having a first input terminal receiving a second variable logic value if the source node is determined as being driven by a first node, wherein an output terminal of the second multiplexer is coupled to the first node; and enable the second multiplexer to pass the second variable value to the destination node via the first node and the source node to check for connectivity between the first node and the destination node.

17. The non-transitory computer readable medium of claim 16, wherein the instructions further cause the processor to:

inhibit the first multiplexer from passing the first variable when the second multiplexer is enabled to pass the second variable.

18. The non-transitory computer readable medium of claim 15, wherein the instructions further cause the processor to:

assign a first property identifier to the connectivity check between the source node and the destination node.

19. The non-transitory computer readable medium of claim 18, wherein the first property identifier has a single bit defining an enable value of the first multiplexer.

20. The non-transitory computer readable medium of claim 16, wherein the first multiplexer is a 2-to-1 multiplexer.

* * * * *